(12) United States Patent
Menon et al.

(10) Patent No.: US 10,571,861 B2
(45) Date of Patent: Feb. 25, 2020

(54) METHODS AND SYSTEMS FOR GENERATING A THREE-DIMENSIONAL HOLOGRAPHIC MASK HAVING TOPOGRAPHICAL PATTERN WITH MORE THAN TWO DISCRETE LEVELS

(71) Applicant: University of Utah Research Foundation, Salt Lake City, UT (US)

(72) Inventors: Rajesh Menon, Salt Lake City, UT (US); Peng Wang, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 364 days.

(21) Appl. No.: 15/274,993

(22) Filed: Sep. 23, 2016

(65) Prior Publication Data

US 2017/0010585 A1 Jan. 12, 2017

Related U.S. Application Data

(62) Division of application No. 13/954,437, filed on Jul. 30, 2013, now abandoned.

(Continued)

(51) Int. Cl.
*G02B 5/32* (2006.01)
*G03H 1/00* (2006.01)
(Continued)

(52) U.S. Cl.
CPC ............ *G03H 1/0808* (2013.01); *G02B 5/32* (2013.01); *G03H 1/0005* (2013.01); *G03H 1/08* (2013.01);
(Continued)

(58) Field of Classification Search
CPC .... G02B 5/1857; G02B 5/0252; G02B 5/203; G02B 5/32; G02B 27/0109; G02B 27/0944; G03F 7/70283; G03F 7/70408; G03H 1/0005; G03H 2001/0094; G03H 1/0244; G03H 1/0248; G03H 2001/026;
(Continued)

(56) References Cited

U.S. PATENT DOCUMENTS 3,582,176 A 6/1971 Mathisen
5,144,484 A * 9/1992 Southwell ............... G02B 3/00
359/565

(Continued)

OTHER PUBLICATIONS

Arnold, "E-Beams Written Computer Generated Holograms." Honeywell Corporate Technology Center; Bloomington, Minnesota 55420; Aug. 1983; pp. 1-1-5-1.

(Continued)

*Primary Examiner* — Ryan S Dunning
(74) *Attorney, Agent, or Firm* — Thorpe North & Western, LLP

(57) ABSTRACT

A system for surface patterning using a three dimensional holographic mask includes a light source configured to emit a light beam toward the holographic mask. The holographic mask can be formed as a topographical pattern on a transparent mask substrate. A semiconductor substrate can be positioned on an opposite site of the holographic mask as the light source and can be spaced apart from the holographic mask. The system can also include a base for supporting the semiconductor substrate.

15 Claims, 18 Drawing Sheets

Related U.S. Application Data

(60) Provisional application No. 61/677,386, filed on Jul. 30, 2012.

(51) Int. Cl.
  *G03H 1/08* (2006.01)
  *H01L 21/306* (2006.01)
  *H01L 21/67* (2006.01)

(52) U.S. Cl.
  CPC .. *H01L 21/30604* (2013.01); *H01L 21/67011* (2013.01); *G03H 2001/0094* (2013.01); *G03H 2001/0816* (2013.01); *G03H 2210/30* (2013.01)

(58) Field of Classification Search
  CPC ... G03H 2001/0264; G03H 2001/0268; G03H 1/0272; G03H 2001/043; G03H 2001/0439; G03H 1/08; G03H 1/0808; G03H 2001/0816; G03H 2001/2221; G03H 2210/30; G03H 2210/33; G03H 2240/23; G03H 2240/24; G03H 2240/42; G03H 2240/43; G03H 2240/53; G03H 2240/54; G03H 2240/56; G03H 2260/14; G03H 2260/35; G03H 2260/54; G03H 2270/11; G03H 2270/14; G03H 2270/21; G11B 7/0065; G11B 7/24044; H01L 21/30604; H01L 21/67011
  USPC .......... 359/1, 3, 4, 7, 8, 27, 30, 35; 430/1, 2
  See application file for complete search history.

(56) References Cited

U.S. PATENT DOCUMENTS

| | | | |
|---|---|---|---|
| 5,695,894 A | 12/1997 | Clube | |
| 5,705,298 A | 1/1998 | Knoedl, Jr. | |
| 5,949,557 A | 9/1999 | Powell | |
| 5,955,221 A | 9/1999 | Sanders et al. | |
| 6,052,517 A | 4/2000 | Matsunaga et al. | |
| 6,097,472 A | 8/2000 | Tanaka et al. | |
| 6,120,950 A | 9/2000 | Unno | |
| 6,453,458 B1 | 9/2002 | Fukano et al. | |
| 6,542,218 B2 | 4/2003 | Anderson et al. | |
| 6,893,800 B2 | 5/2005 | Jessen et al. | |
| 7,145,633 B2 | 12/2006 | Nishimoto et al. | |
| 7,325,223 B2 | 1/2008 | Hu et al. | |
| 7,499,149 B2 | 3/2009 | Hendriks et al. | |
| 7,523,435 B2 | 4/2009 | Bollepalli et al. | |
| 7,978,386 B2 | 7/2011 | Purvis et al. | |
| 2006/0121357 A1 | 6/2006 | Clube | |
| 2006/0232838 A1 | 10/2006 | Clube | |
| 2006/0291024 A1 | 12/2006 | Parker et al. | |
| 2008/0094674 A1 | 4/2008 | Purvis et al. | |
| 2008/0204737 A1 | 8/2008 | Ogawa et al. | |
| 2010/0162199 A1 | 6/2010 | Liu et al. | |
| 2011/0008577 A1* | 1/2011 | Miyake | B29C 59/022 428/156 |
| 2011/0243463 A1 | 10/2011 | Suganuma | |
| 2011/0261427 A1* | 10/2011 | Hart | G03H 1/2249 359/22 |
| 2013/0120813 A1* | 5/2013 | Cowling | G03F 7/703 359/9 |

OTHER PUBLICATIONS

Bordovsky et al, "Pixelated Phase Mask as Novel Lithographic RET." Optical Micolithography; SPIE; Feb. 24, 2008; vol. 6924; pp. 69240E-1-69240E-14.

Clube et al, "Large Field High-Resolution Photolithography." Enabling Technologies for Optical Microsensors and Microsystems; SPIE; Jun. 16, 1997; vol. 3099; pp. 36-45.

Dominguez-Caballero, "Optimization of the Holographic Process for Imaging and Lithography" Thesis MIT; Massachusetts Institute of Technology; 2010; pp. 1-301.

Kim et al, "Broadband Multispectral Solar Concentrator." Presentation; Menon research group; Department of Electrical Engineering; University of Utah; Oct. 15, 2010; 37 pages.

Maiden, "Lithography in Three Dimensions Using Computer-Generated Holograms." Durham theses; Durham University; Sep. 2005; pp. 1-271.

Park et al, "TIR Holographic Lithography Using Surface Relief Hologram Mask." Korean Journal of Optics and Photonics; Optical Society of Korea; 2009; vol. 20, Issue 3; pp. 175-181.

Purvis et al, "Lithographic Patterning of Bihelical Tracks Onto Conical Substrates." Journal of Micro/Nanolithography; Society of Photo-Optical Instrumentation Engineers; Dec. 18, 2007; vol. 6 Issue 4; pp. 043015-1-043015-4.

Suzuki et al, "Curved Waveguide Fabrication Using Femtosecond Laser Processing With Glass Hologram." Frontiers in Ultarfast Optics; SPIE; Feb. 25, 2010; vol. 7589; 10 Pages.

Quentel, "Multilevel Diffractive Optical Element Manufacture by Excimer Laser Ablation and Half-Tone Masks." Laser Microengineering in Optoelectronics; SPIE; Jan. 20, 2001; vol. 4274; pp. 420-431.

* cited by examiner

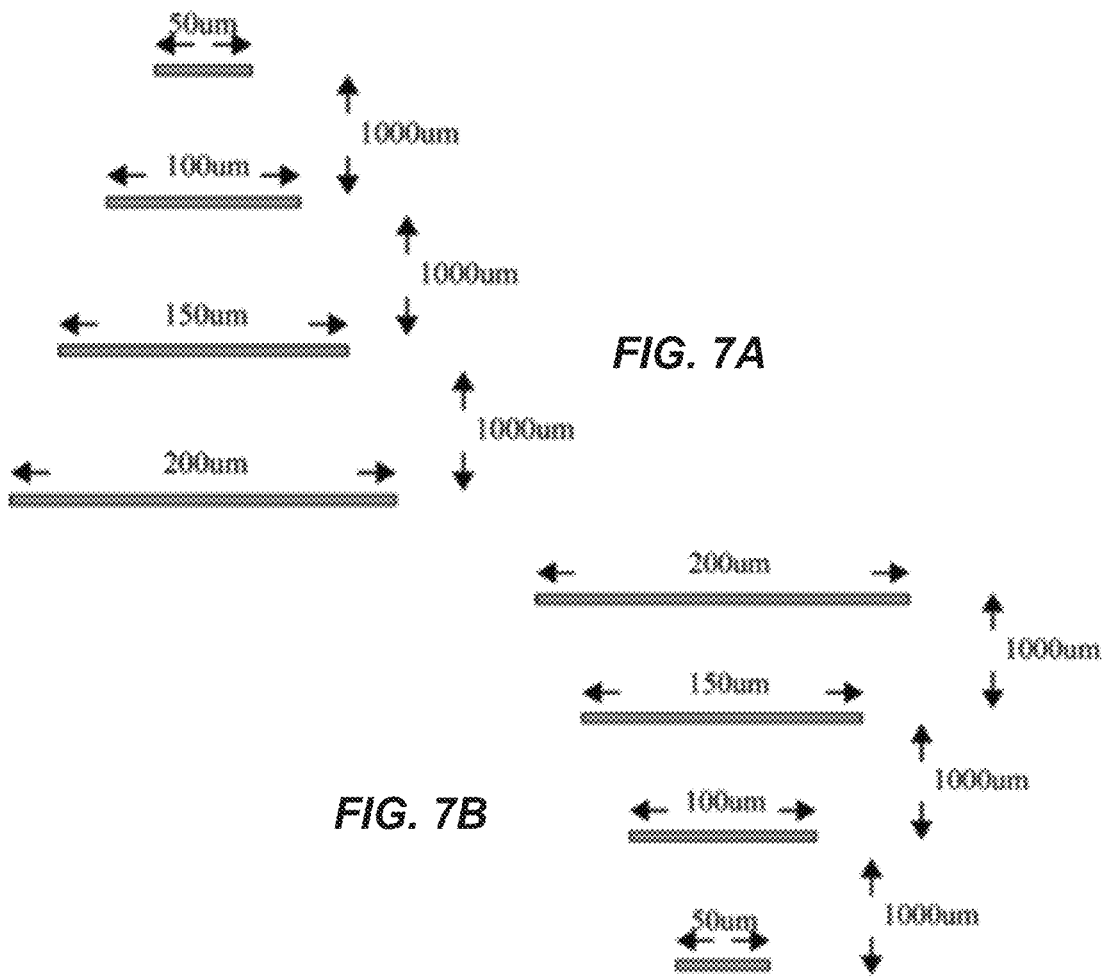
FIG. 7A
FIG. 7B
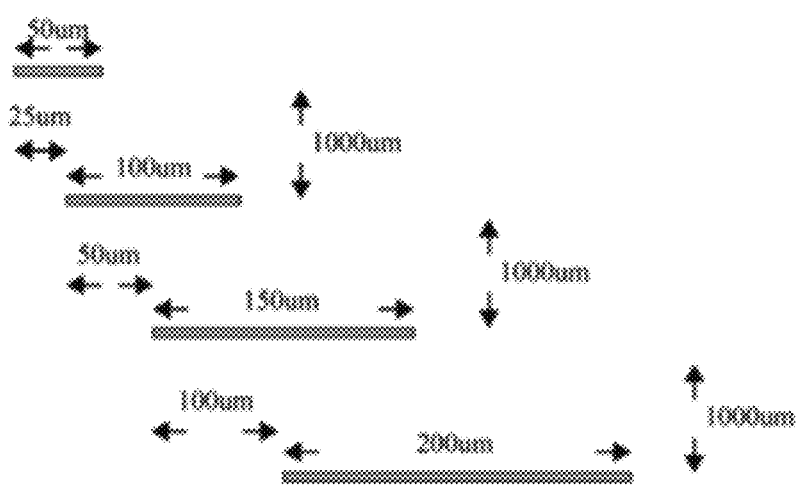
FIG. 7C ns and systems for generating a three-dimensional holographic mask having topographical pattern with more than two discrete levels

RELATED APPLICATION

This application is a divisional of U.S. application Ser. No. 13/954,437, filed Jul. 30, 2013, which claims the benefit of U.S. Provisional Patent Application No. 61/677,386, filed Jul. 30, 2012, which are each incorporated herein by reference.

FIELD OF THE INVENTION

This invention relates generally to masks and methods of making such masks for purposes of patterning structures on various substrates. Accordingly, the invention involves the fields of physics, semiconductor processing, and holographic patterning.

BACKGROUND

Patterning of microscale and nanoscale structures in three dimensions can be difficult for a variety of reasons. In the conventional sense, such patterning is achieved by performing a layer-by-layer patterning of 2D (two dimensional) planes. This can be tedious, time consuming and expensive. Challenges may also exist for aligning one layer on top of another.

Another approach to 3D (three dimensional) patterning is via the use of two-photon lithography. In this approach, a laser beam is focused into a small diffraction-limited spot inside a photosensitive material. This material is designed so as to undergo a two-photon reaction. Typically, this reaction results in polymerization. Since the two-photon reaction is sensitive to the intensity of light, the reaction only occurs substantially in a narrow 3D region at the center of the focal spot.

Conventional lithography is performed on flat (planar) surfaces and materials and layers are built up via multiple patterned layers each formed by deposition of a layer followed by substractive processing. Therefore, patterning non-planar surfaces using such approaches presents additional challenges and is generally more difficult or impossible depending on surface geometry and desired patterns.

SUMMARY

An iterative pixelated perturbation method for generating a three dimensional holographic mask based on a predetermined three dimensional pattern can include providing a starting pattern for the holographic mask and computing resulting images at multiple planes parallel to the holographic mask using a processor. A metric representing a combination of diffraction efficiency of the holographic mask and/or fidelity of a resulting image compared with the predetermined pattern for the images at the multiple planes can be computed using the processor. An optic height of a first pixel in the starting pattern can be perturbed to create an intermediate pattern. Resulting images and the metric can be computed for the intermediate pattern. A determination can be made as to whether the metric for the intermediate pattern is an improvement over the metric for the starting pattern. Perturbation of the optic height of the first pixel may include increasing or decreasing the optic height by a predetermined height unit. The method can also include perturbing the optic height of the first pixel in an opposite increasing or decreasing optic height direction when the metric for the intermediate pattern is not an improvement over the metric for the starting pattern to create a second intermediate pattern. The images and the metric can be computed for the second intermediate pattern and a determination can be made as to whether the metric for the second intermediate pattern is an improvement over the metric for the starting pattern. Perturbation of the optic height of the first pixel may be discarded when the metric for the second intermediate pattern is not an improvement over the metric for the starting pattern. The steps of perturbing, computing, and determining for a second pixel and additional pixels can also subsequently be performed.

The method can include the steps of perturbing, computing, and determining for a second pixel when the metric for the intermediate pattern is an improvement over the metric for the starting pattern.

Computing images at multiple planes parallel to the holographic mask can include computing images corresponding to image slices from the predetermined three dimensional pattern. The images may be one-dimensional, two dimensional or three dimensional.

The method may also include fabricating the holographic mask as a topographical pattern on a transparent substrate.

A system for surface patterning using a three dimensional holographic mask includes a light source configured to emit a light beam toward the holographic mask. The holographic mask can be formed as a topographical pattern on a transparent mask substrate. A semiconductor substrate can be positioned on an opposite side of the holographic mask from the light source and can be spaced apart from the holographic mask. The system can also include a base for supporting the semiconductor substrate. Notably, the semiconductor substrate can be a planar or a non-planar surface.

The system can include a beam expander positioned between the light source and the holographic mask. The beam expander can be configured to expand the light beam.

The base can be a mobile base configured to move the semiconductor substrate in one or more of a linear or rotational x, y, or z dimension.

The holographic mask can enable patterning of the semiconductor substrate in both step-wise patterns (i.e. digital patterns) and angled patterns (i.e. analog patterns).

A method of patterning a resist using a three dimensional holographic mask is also provided in accordance with an example of the present technology. The method can include positioning the holographic mask between a light source and a semiconductor substrate and which is spaced apart from the semiconductor substrate. The holographic mask can be formed as a topographical pattern on a transparent mask substrate. The holographic mask can be illuminated with the light source to project a predetermined pattern in three spatial dimensions onto the semiconductor substrate.

The method can also include rotationally moving the semiconductor substrate in at least one of x, y, or z dimensions and illuminating the holographic mask with the light source to project the predetermined pattern in three spatial dimensions onto a second portion of the semiconductor substrate.

Illuminating the holographic mask to project the predetermined pattern onto the semiconductor substrate may include illuminating the holographic mask to project the predetermined pattern onto a first portion of the semiconductor substrate. The method may further include linearly moving the semiconductor substrate in one of x, y, or z dimensions and illuminating the holographic mask with the light source to project the predetermined pattern in three spatial dimensions onto a second portion of the semiconductor substrate.

The second portion of the semiconductor substrate may be at a different elevation than the first portion of the semiconductor substrate. The transparent mask substrate can be a substantially planar surface with the topographical pattern thereon and the semiconductor substrate can be a planar or a non-planar surface. The predetermined pattern can be a combination of analog, binary, and multi-level patterns.

The semiconductor substrate can include a resist layer thereon. The method can further include exposing the resist layer to create a resist layer pattern and etching the predetermined pattern into the semiconductor substrate using the resist layer pattern to create a three dimensional topography in the semiconductor substrate.

BRIEF DESCRIPTION OF THE DRAWINGS

FIG. 7A-7C are a series of two dimensional target image slices for a mask showing pyramid, inverted pyramid, and offset pyramid designs in accordance with three examples of the present technology;

DETAILED DESCRIPTION

Figure 1A:
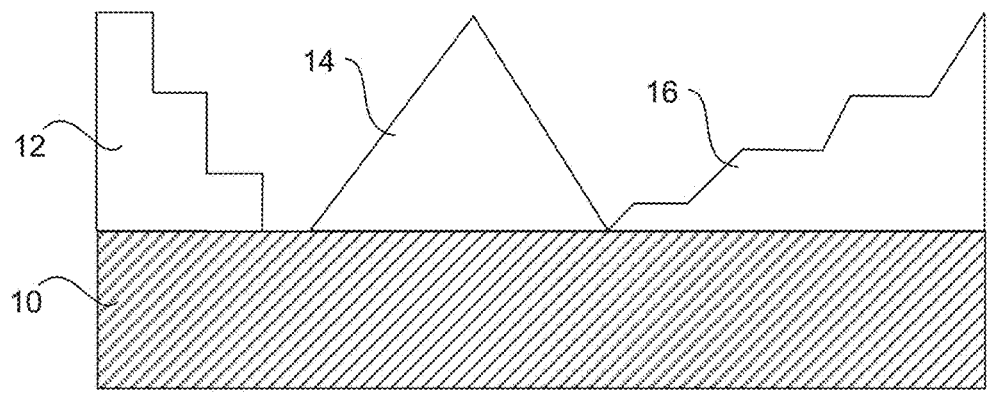
FIGS. 1A-1B illustrate examples of different types of patterns on planar and non-planar substrates in accordance with examples of the present technology.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

As used herein, the terms "light", "illumination" and "electromagnetic radiation" can be used interchangeably and can refer to light or electromagnetic radiation in the ultraviolet, visible, near infrared and infrared spectra. The terms can further more broadly include electromagnetic radiation such as radio waves, microwaves, x-rays, and gamma rays. Thus, the term "light" is not limited to electromagnetic radiation in the visible spectrum.

As used herein, a "substrate" can refer to any of a variety of materials, layers, etc. For example, in terms of a semiconductor, the "substrate" may refer to a silicon wafer, or may refer to any of a variety of dielectric, conductive, or other layers in the semiconductor. Other materials can be used as a substrate as well. In some cases, the substrate may be rigid. However, flexible substrates can also be used. For purposes of this disclosure, the substrate can generically refer to a layer or material capable of supporting another layer or material thereon.

It is noted that, as used in this specification and in the appended claims, the singular forms "a," "an," and "the" include plural referents unless the context clearly dictates otherwise. Thus, for example, reference to "a layer" includes one or more of such features, reference to "a pixel" includes reference to one or more of such elements, and reference to "processing" includes reference to one or more of such steps.

As used herein, the terms "about" and "approximately" are used to provide flexibility, such as to indicate, for example, that a given value in a numerical range endpoint may be "a little above" or "a little below" the endpoint. The degree of flexibility for a particular variable can be readily determined by one skilled in the art based on the context.

As used herein, the term "substantially" refers to the complete or nearly complete extent or degree of an action, characteristic, property, state, structure, item, or result. The exact allowable degree of deviation from absolute completeness may in some cases depend on the specific context. However, the nearness of completion will generally be so as to have the same overall result as if absolute and total completion were obtained. The use of "substantially" is equally applicable when used in a negative connotation to refer to the complete or near complete lack of an action, characteristic, property, state, structure, item, or result.

As used herein, a plurality of components may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

Reference will now be made to the exemplary embodiments illustrated, and specific language will be used herein to describe the same. It will nevertheless be understood that no limitation of the scope of the technology is thereby intended. Additional features and advantages of the technology will be apparent from the detailed description which follows, taken in conjunction with the accompanying drawings, which together illustrate, by way of example, features of the technology.

With the general examples set forth in the Summary above, it is noted in the present disclosure that when describing the system, or the related devices or methods, individual or separate descriptions are considered applicable to one other, whether or not explicitly discussed in the context of a particular example or embodiment. For example, in discussing a device per se, other device, system, and/or method embodiments are also included in such discussions, and vice versa.

Furthermore, various modifications and combinations can be derived from the present disclosure and illustrations, and as such, the following figures should not be considered limiting.

FIG. 1A shows multiple example three dimensional pattern types which can be produced. The substrate 10 can be nominally planar (or flat). The patterns can be composed of discrete multiple levels as illustrated by digital pattern 12. Such digital patterns are characterized by stepped variations in height which can be extended in multiple dimensions. However, each digital pattern can be subdivided into an array of pixels which each have a stepped height independent of adjacent pixels. These digital patterns can be distinct from analog patterns 14. Such analog patterns can have a continuous profile which can be angled or curved. Hybrid patterns 16 can include aspects of both digital and analog type patterns. For example, discrete sections of the pattern can have varying angles.

Figure 1B:
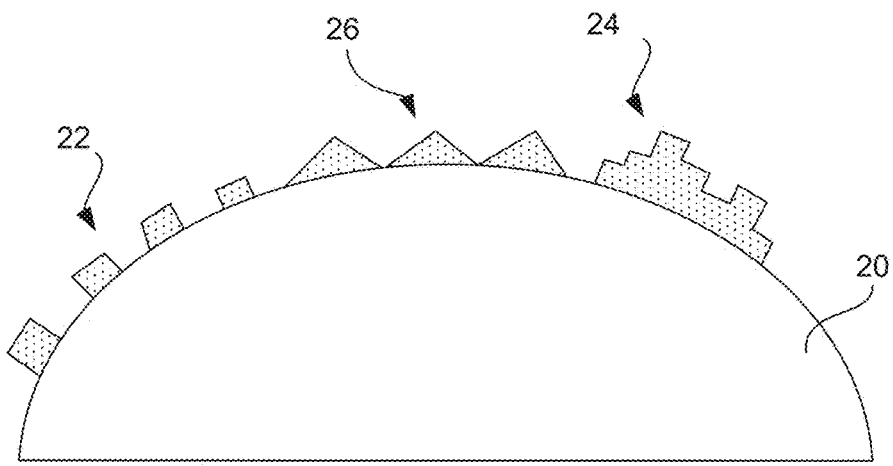

A non-planar substrate 20 is shown in FIG. 1B as a partial sphere. In this case, various patterns can be generated on a surface of the sphere. The patterns may be digital patterns 22 or multi-level digital patterns 24 or continuous-tone (i.e. analog patterns 26) in nature. Accordingly, the substrate can be any non-flat surface such as but not limited to, undulating, spherical, ellipsoid, arcuate, dimpled, or the like.

Such complex patterns can be obtained by utilizing optical patterning constructing and using a holographic mask. The holographic mask can be designed so as to project the desired pattern in three spatial dimensions when illuminated. The design method is described in more detail below. However, by illuminating the holographic mask, for example with a uniform plane wave (i.e. uniform within the field of interest), and setting a gap between the mask and the substrate accurately, 3D light-intensity distributions can be recorded in a conventional photoresist. After this exposure, the photoresist can be developed as is common in photolithographic processes, resulting in pattern types similar to those illustrated in FIG. 1. The illumination may be other wavefronts as well such as but not limited to Gaussian waves, spherical waves, cylindrical waves, wavefronts formed using monopole or quad-pole or annular illumination, and the like. However, the illumination to be used is taken into account when designing the holographic mask. As such, different illumination sources can result in different corresponding holographic masks even for a common target desired pattern. It is also possible to utilize multiple wavelengths for illumination, which may be accounted for in the design process and with source mask optimization considerations.

Figure 2:
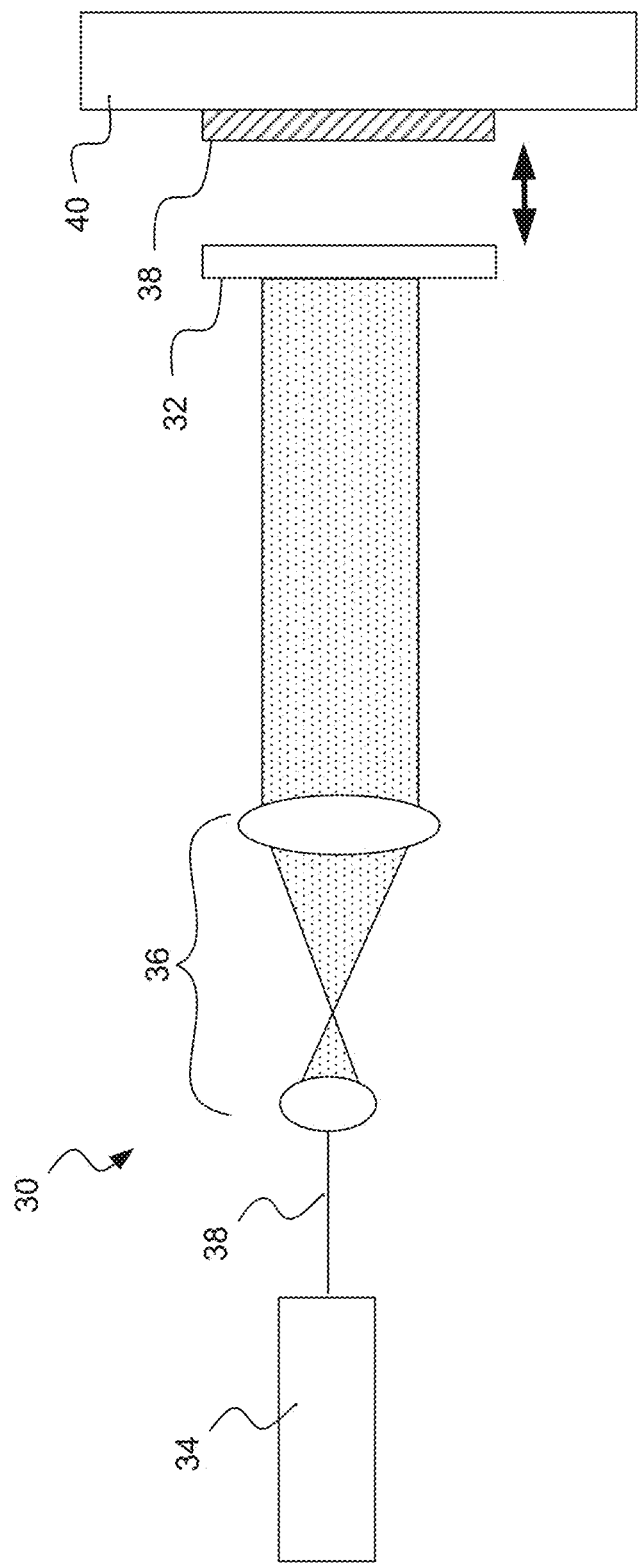
FIG. 2 illustrates an exposure system for patterning a substrate using a holographic mask in accordance with an example of the present technology.

FIG. 2 illustrates an example of an exposure system 30 which incorporates a holographic mask 32. The holographic mask is illuminated by a light source 34. A spatial filter (not shown) can optionally be used to remove high-frequency noise from the beam. A beam expander 36 can be oriented within the light path 38 to ensure that a sufficient area of the holographic mask is illuminated. Patterned light passing through the holographic mask is then directed to a substrate 38 set on a scanning stage 40. The gap distance between the mask and the substrate is set based on the design which also accounts for distance of the photoresist layer (not shown) placed on the substrate and diffraction limits.

The substrate may be mounted on a scanning stage to allow movement during or after exposure to the patterned light. If the substrate is moved in between exposures, it is possible to repeat the patterns on the substrate in a cost-effective and rapid manner. The substrate may also be scanned along the optical axis, which will allow for the patterns to be repeated in three dimensions. Optionally, different patterns can be exposed at different depths in the photoresist.

The holographic mask can be formed of an optically transmissive material which provides sufficient phase shift as required by the holographic mask design at the wavelengths of interest, also is readily fabricated using conventional patterning process. Non-limiting examples of suitable materials for the mask can include photoresists, transparent polymers, glass, transparent plastics, fused silica, quartz, and the like. Although dimensions can vary, thickness of the holographic mask can often be from about 0.5 µm to about 10 µm.

Figure 3A:
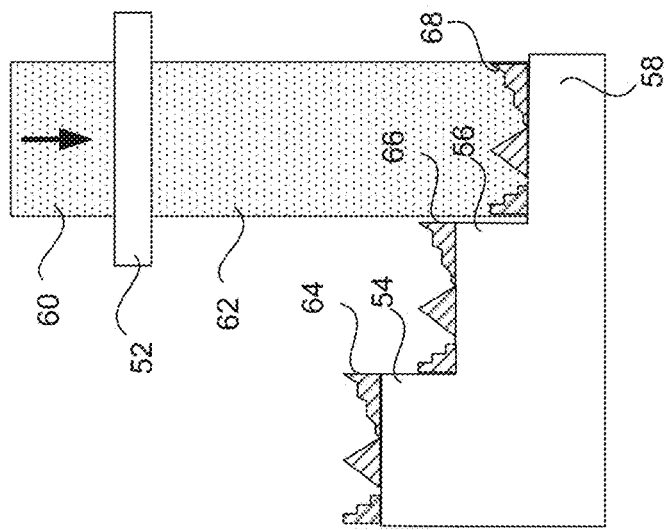
FIG. 3A-3C illustrates a process of scanning a substrate in three dimensions for repeated patterning in accordance with an example of the present technology.
Figure 3B:
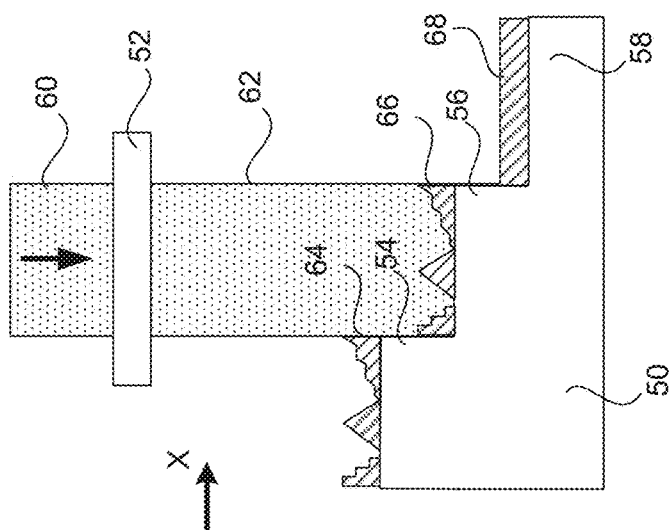
Figure 3C:
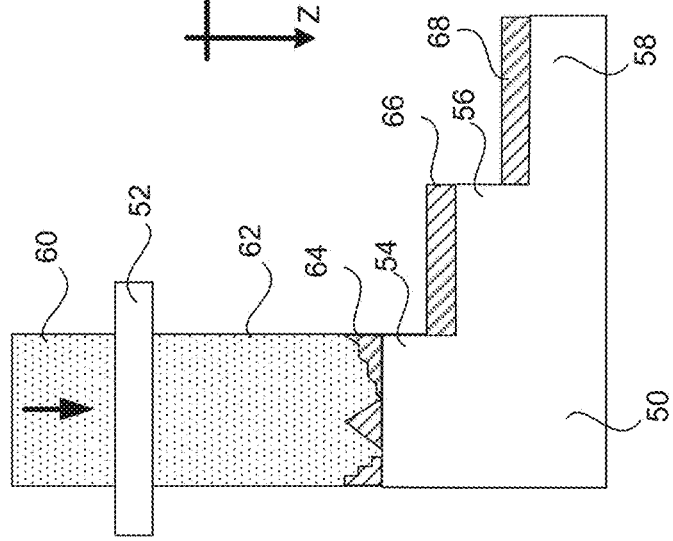

FIGS. 3A-3C illustrate scanning the substrate in three dimensions which allows for stepped and repeated patterning. In FIG. 3A, the substrate 50 includes multiple physical first, second and third steps 54, 56 and 58, respectively, or multiple levels at different elevations with respect to the holographic mask 52. In one exposure stage, illumination 60 can be passed through the holographic mask to produce a patterned light 62 which selectively exposes portions of a first photoresist layer 64.

By moving the substrate relative to the holographic mask in the X and the Z directions (it can optionally be moved in Y as well), the pattern created by the holographic mask can be repeated. Either or both of the illumination and halographic mask, and the substrate can be moved to expose different locations on the substrate. FIG. 3B illustrates a second exposure stage where the illumination 60 is oriented over second step 56. In this second stage, photoresist layer 66 is patterned according to a pattern in the photographic mask. Similarly, FIG. 3C illustrates a third exposure stage in which illumination 60 and photographic mask 52 are oriented over third step 58 in which photoresist layer 68 is patterned. Although the exposure pattern is illustrated as a common pattern across each of the multiple exposure stages, the holographic mask can optionally be changed or modified to produce different patterns at one or more locations as the holographic mask is translated with respect to the substrate. Furthermore, any number of exposure stages can be performed in X, Y and Z directions depending on the desired patterns and accompanying substrate. For example, if the substrate has steps in the Z direction (along the optical axis) as shown, then this can allow for 3D patterning on non-flat surfaces.

Figure 4:
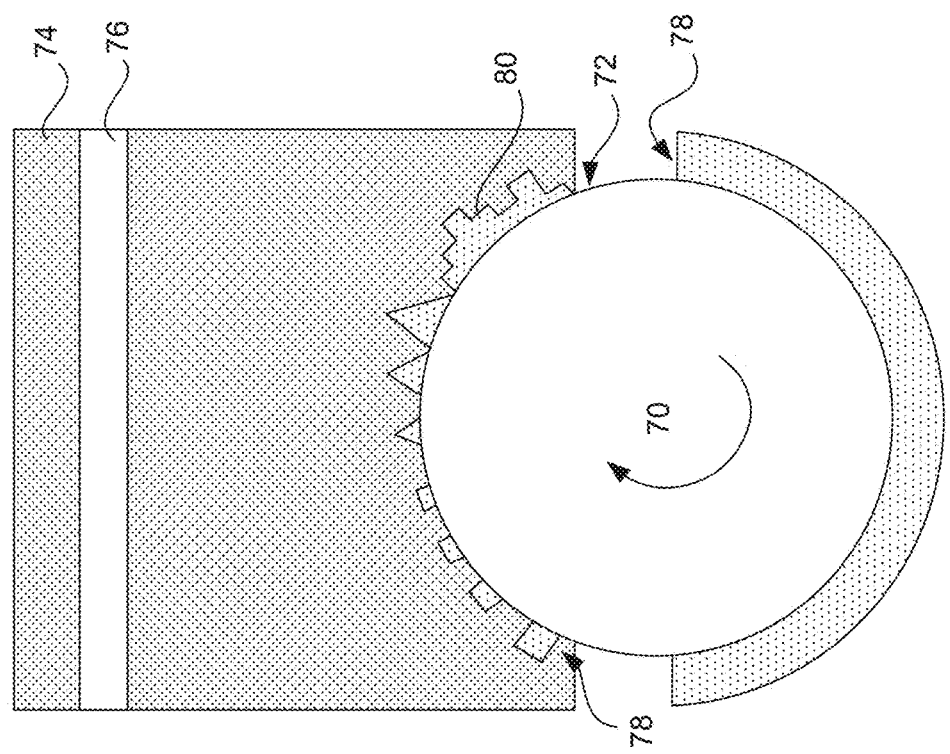
FIG. 4 illustrates patterning a roller stamp rotated on an axis in accordance with an example of the present technology.

Consistent with the above discussion, FIG. 4 illustrates an example of patterning a roller stamp 70 having a curved substrate surface 72. Such a stamp may be used in roll-to-roll nanoimprint lithography and is typically cylindrical. An illumination 74 can pass through a corresponding holographic mask 76. The holographic mask can be configured to expose a photoresist layer 78 in the substrate surface to form a patterned layer 80. The roller can be rotated in between exposures to provide full surface coverage as required. In this case, the scanning stage will be replaced by a rotating axis, which holds the roller. In this case, the roller may be mounted on a rotating axle instead of a stage. The roller can be rotated by a specific angle such that the same or different pattern is repeated on its surface at a second location on the substrate surface. If different patterns are desired, the holographic mask may be replaced or varied in between the rotations. A combination of translation from a stage and rotation may be used for more complicated substrate geometries.

Figure 5:
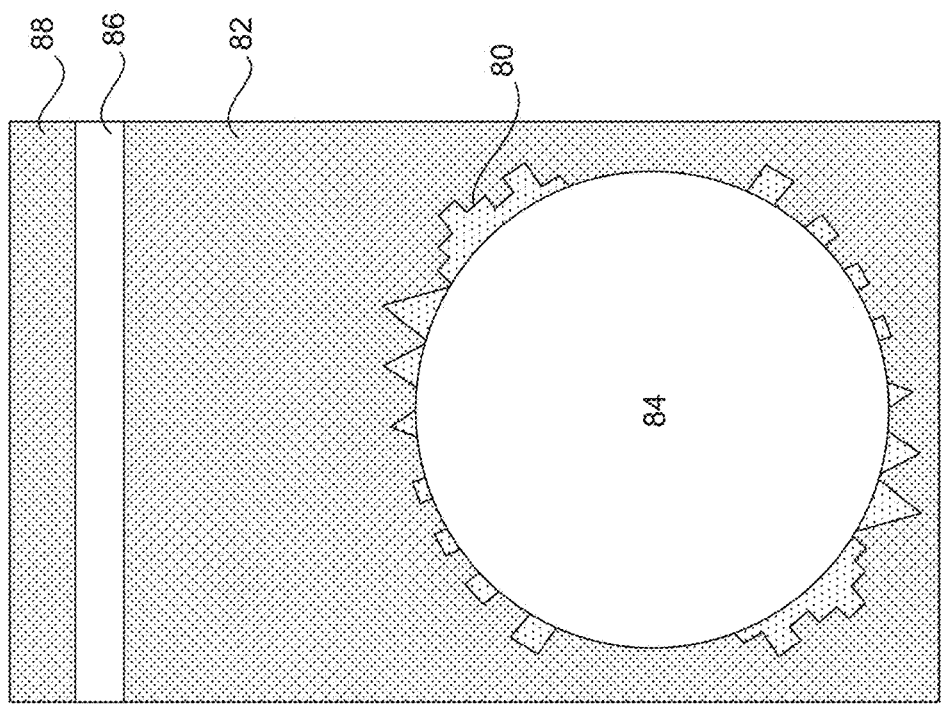
FIG. 5 illustrates patterning a transparent roller stamp with a single exposure in accordance with an example of the present technology.

Furthermore, an entire roller surface may be patterned with a single exposure. This is possible if the roller is formed of material that is transparent to the illuminating wavelength. FIG. 5 illustrates a single exposure of patterned illumination 82 onto a transparent roller 84. In this case, the holographic mask 86 is designed to image the desired pattern on both the front and back surfaces of the roller. Therefore, a single exposure of illumination 88 can be passed through the holographic mask to pattern the entire surface of interest. The design process takes into account any reflections off the surface of the roller (e.g. incorporating Fresnel reflection coefficients to determine amount of light reflected from the surface). In this case, no rotation is performed while patterning and the patterning can be more rapid. However, the design of the holographic mask is more complicated. The patterns are created simultaneously such that the design algorithm forms an image on any non-planar surface such as a 3D spherical surface. So the patterns on each side are taken into account. Absorption in the photoresist can often be minimal, but such effects can be taken into account into the design as needed.

The design method for the holographic mask is based on a modified version of a direct-binary search algorithm, which can be referred to as an iterative pixelated perturbation algorithm (IPPA). The holographic mask (holomask) is represented as a matrix of height values. This arises from the fact that in most practical cases, the mask will be fabricated as a topographical (height) pattern of transparent polymer, photoresist, plastic, glass or fused silica, quartz, or other suitable material on a transparent substrate such as glass. The pixel-sizes and the discrete height levels are determined by the fabrication technology and result in varying diffraction patterns which affect a resulting image within the photoresist and at the substrate. For example, the pixel sizes can in the tens of nanometers if the fabrication is done with scanning-electron-beam lithography or focused ion-beam lithography, or in the hundreds of nanometers and microns range with optical patterning, diamond turning, or 3D printing. Height levels can be anywhere from a few nm to many microns. Again, the above mentioned fabrication techniques can be used. Although pixel sizes and height levels can vary considerably, in one example, the pixel size can range from about 10 nm to about 500 μm while the height levels can range from about 10 nm to about 500 micrometer. The design algorithm is based on a direct nonlinear optimization method.

Figure 6:
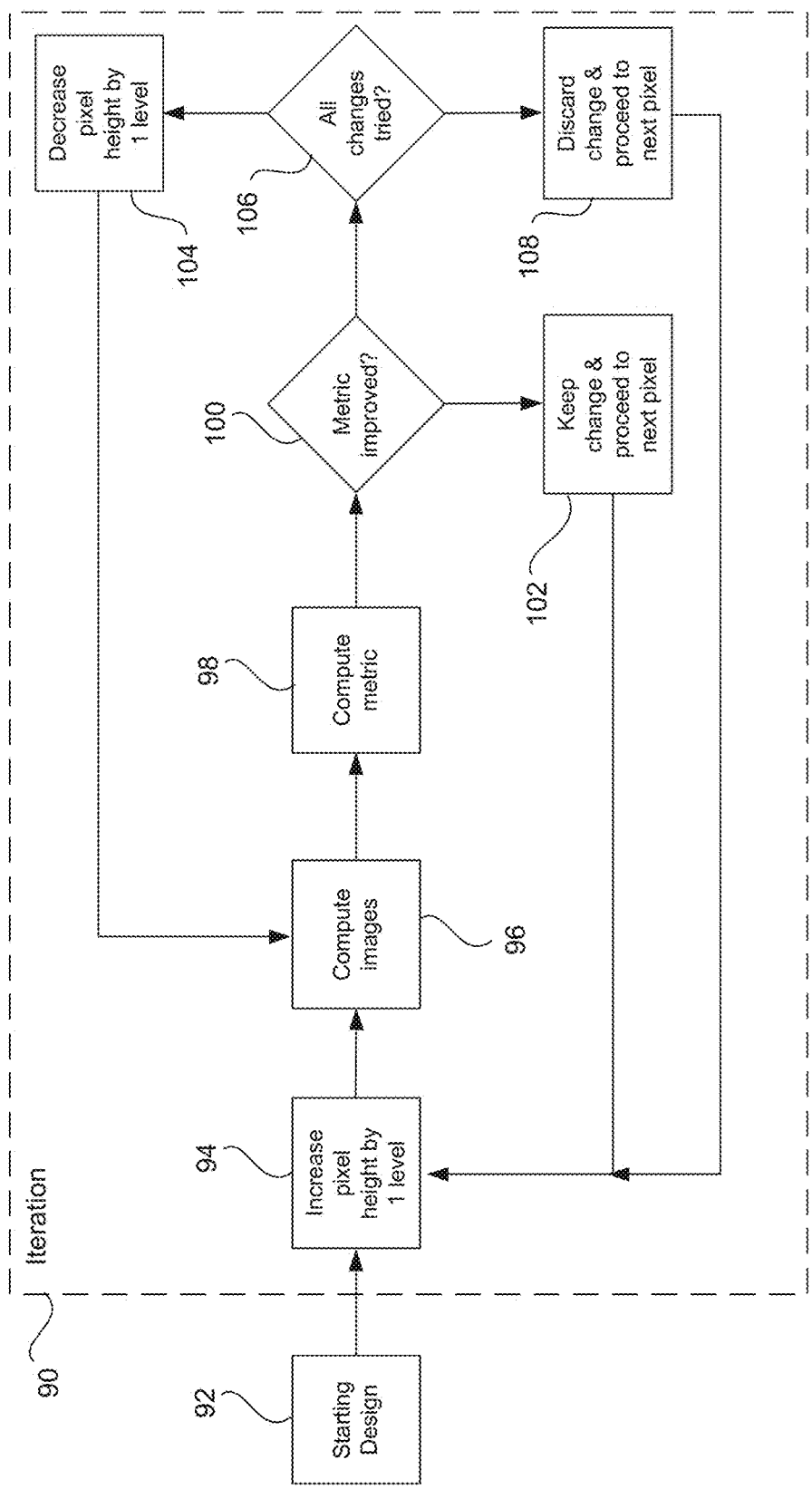
FIG. 6 is a block diagram of a method for designing a holographic mask in accordance with an example of the present technology.
Figure 8A:
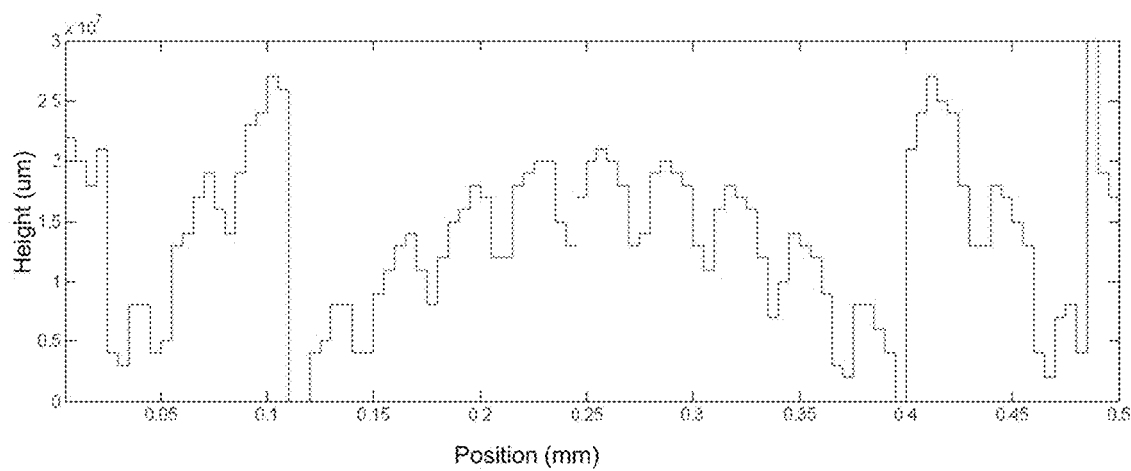
FIGS. 8A-8F include graphs representing results of various holographic mask design examples in accordance with the present technology.
Figure 8B:
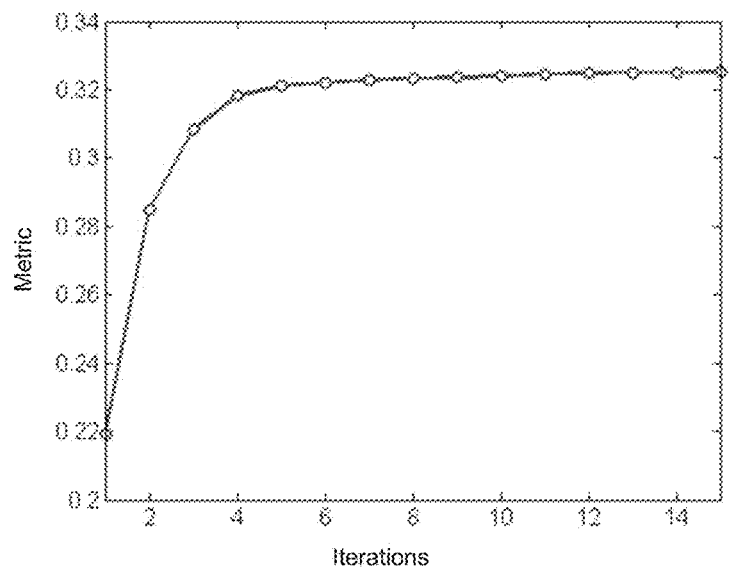
Figure 8C:
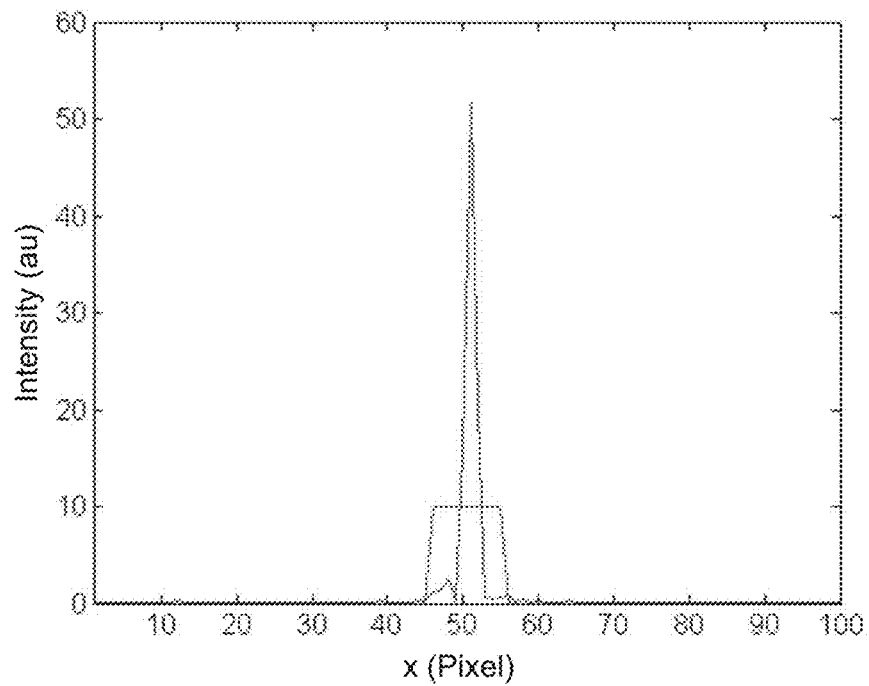
Figure 8D:
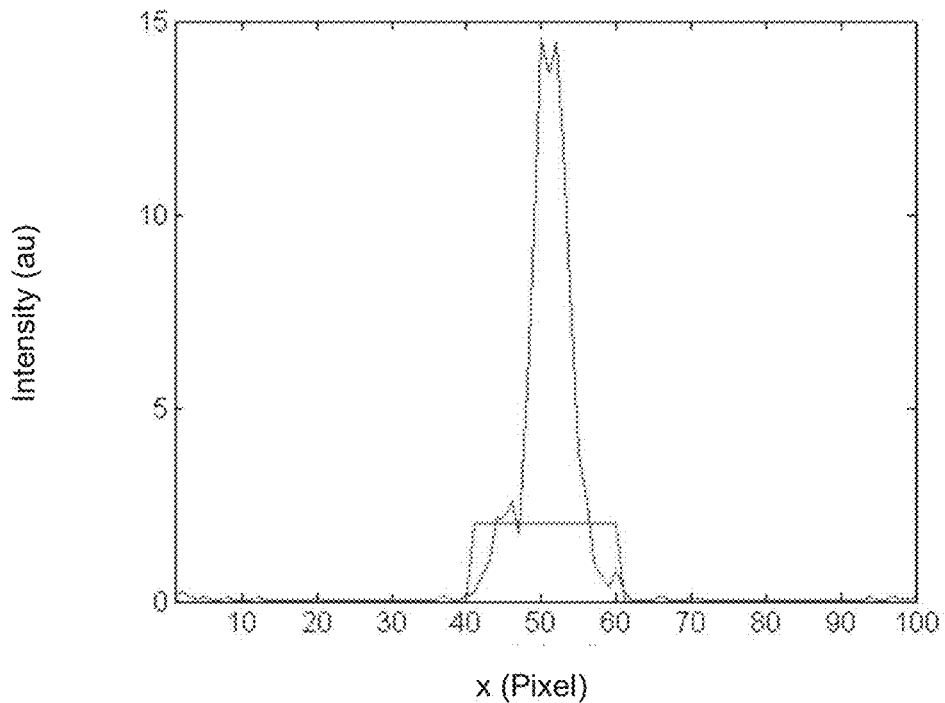
Figure 8E:
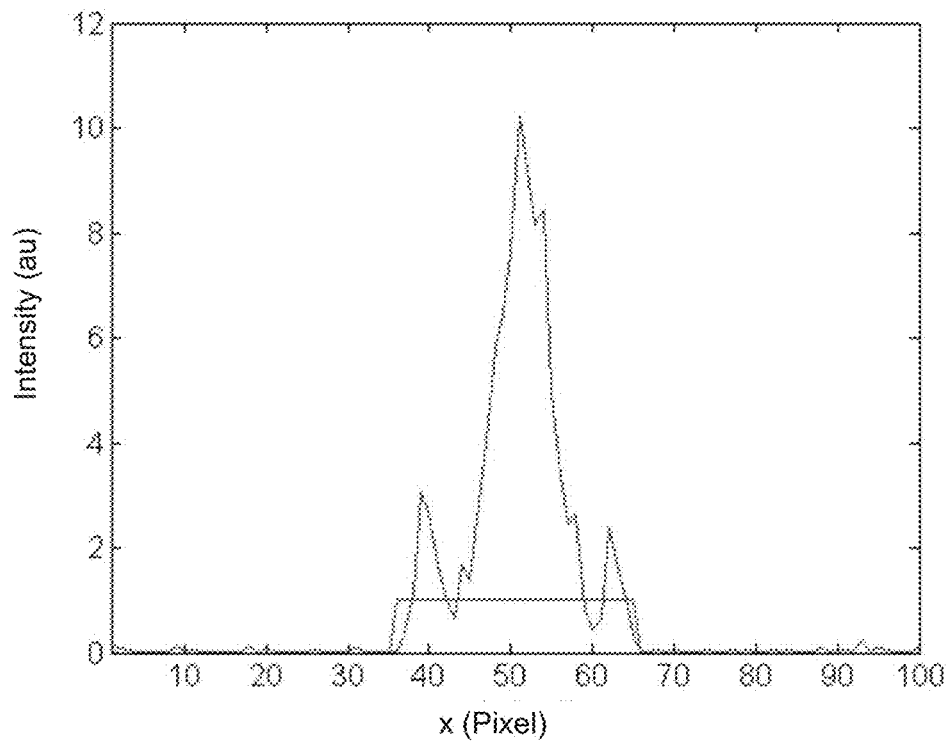
Figure 8F:
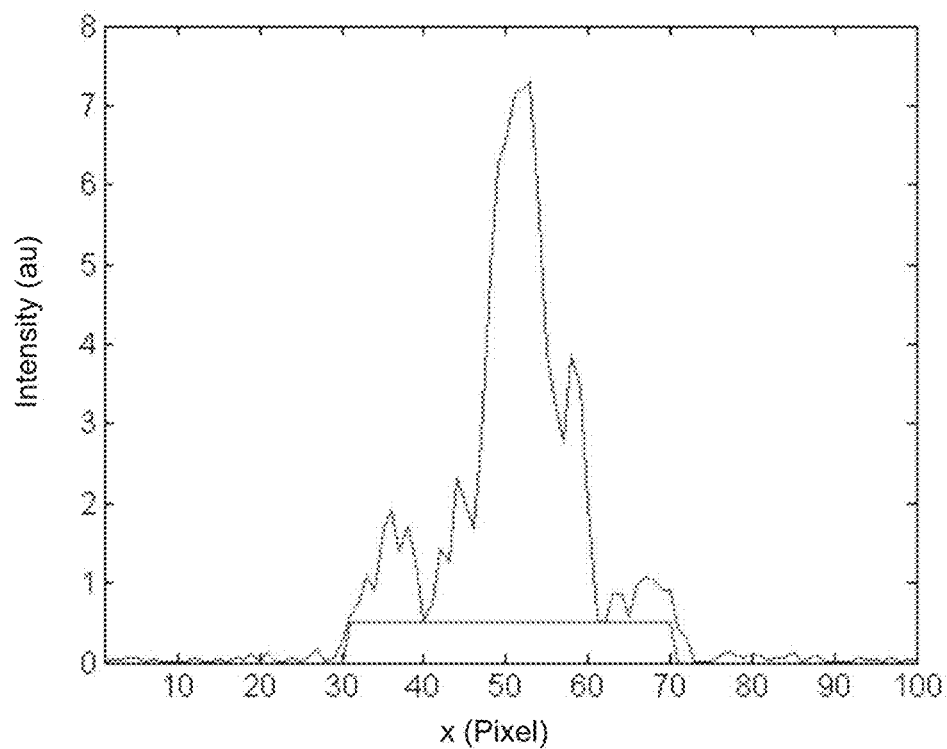

A suitable algorithm which applies this IPPA is illustrated in FIG. 6. The iteration 90 begins with a starting design 92, which can be generated by a variety of means. In one example, a random design may be used as the starting design or the starting design may be generated using a modified-error reduction (MER) approach. Any other starting point could also be used, either by heuristic models, uniform design, or the like. The design includes an array of pixels in two dimensions where each pixel has an initial height determined by the starting design.

Subsequently, the optic-height of the first pixel is perturbed by increasing this height by a pre-defined unit-height 94. Next, resulting images produced at various planes parallel to the holomask are computed 96 using a simple diffraction-based propagation method (such as angular-plane wave spectrum method). Note that the three dimensional desired image is discretized into multiple two dimensional planes. This can be done for computational convenience since two dimensional images are significantly more efficient to compute. However, the three dimensional image can also be directly calculated.

A figure-of-merit (or metric) for each of the resulting images are computed 98. Typically, this metric is a combination of the diffraction efficiency of the holomask and the fidelity of the resulting image. Details of particular metric functions are described later.

Next, if the computed metric is improved 100 from the previous iteration, then the perturbation is kept and steps 94-100 are repeated with another pixel 102. Each subsequent pixel perturbation can be performed in an ordered fashion such as by scanning across the pixel array, although any pattern of pixel perturbation could be utilized. If the consolidated metric is not improved, then steps 96-100 are repeated with the same pixel, but in step 104, the optic-height is reduced by the unit-height as compared to an original iteration height. Finally, if both perturbations have not improved the metric 106, the perturbations are discarded 108 and steps 94-100 are repeated with the next pixel in the pixel array. Once all pixels are considered, the iteration continues with the first pixel again. The iteration stops when all the pixels are considered and there is no change in the metric or the change in metric is within a predetermined range. The direction of scan of the pixel may be changed to improve the results. For instance, one can choose the pixels randomly to achieve a more global search. Furthermore, the IPAA process can be repeated multiple times with varying starting patterns and/or pixel perturbation orders in order to avoid convergence on a local minimum rather than a globally optimized design.

Suitable image metrics can include, but are not limited to, diffraction efficiency, image fidelity, exposure latitude, line-edge roughness, manufacturability, normalized inverse image slope, robustness, throughput, and the like. In some cases, the image metric can be a composite function of multiple metrics (e.g. a linear or non-linear combination). Although several metric functions could be used to drive the iterations, a few particular examples are shown below. These are for illustration and do not in any way limit the scope of the invention. Those skilled in the art will appreciate application of modified metric functions to achieve the desired effect. In the examples shown below, our metric is comprised of two parts, expressed with a linear combination of diffraction efficiency and image fidelity as below:

$$\sigma = f_1 \cdot \eta + f_2 \cdot \varepsilon,$$

where $f_1$ and $f_2$ are weighting factors of efficiency (η) and root-mean-square (RMS) error (ε), respectively. The first term ($f_1 \cdot \eta$) represents the optical efficiency, defined as ratio of the light power within the volume delimited by the desired 3D image or sum of the multiple 2D planes representing slices through the desired 3D image to the power incident on the holomask. The second term ($f_2 \cdot \varepsilon$) represents the root-mean-square (RMS) error of the light field distribution compared to the desired image. The calculated image dose is dependent on the substrate surface and the local direction of the image field. The local direction is determined by the wave vector of the field at that location. The calculated image field can be defined as φ(x, y, z)=A(x, y, z)$e^{i\vec{k}\cdot\vec{r}}$, where A is the field amplitude and $\vec{k}$ is the wave-vector. The effective image or the dose that the photoresist sees is then given by $$D(x, y, z) = |A(x, y, z)|^2 \frac{\vec{k}\hat{n}}{|\vec{k}|} D,$$

where n̂ is the unit surface normal to the photoresist. The RMS error is then defined a $\varepsilon = \sqrt{\iiint (D(x,y,z)-I_d(x,y,z))^2 dxdydz}$, where $I_d$(x, y, z) is the desired image. Since η is increased and E is decreased, the signs for $f_1$ will be positive and $f_2$ negative.

DESIGN EXAMPLES

Three examples of two dimensional (one transverse plane and one plane along the light-propagation direction) images are presented in FIG. 7A-7C to demonstrate the effectiveness of the design method. FIG. 7A-7C shows three target images, each of which is composed of strips (infinitely long into the plane of the paper) of length that varies with gap or propagation distance. The design parameters are listed in Table 1.

TABLE 1

Parameters for 2D Field Generation

| | Design | | |
|---|---|---|---|
| | 1 | 2 | 3 |
| Pixel Size (μm) | 5 | 5 | 5 |
| Number of Levels | 64 | 64 | 64 |
| Thickness (μm) | 2 | 2 | 2 |
| Number of Pixels | 100 | 100 | 100 |
| Material | s1813 | s1813 | s1813 |
| Propagation Distance (m) | 0.03 | 0.03 | 0.03 |
| Gap (m) | 1 | 1 | 1 |
| Wavelength (nm) | 532 | 532 | 532 |
| Number of Slices | 4 | 4 | 4 |

FIG. 7A, Design 1 is a pyramid; FIG. 7B, Design 2 is an inverted pyramid; and FIG. 7C, Design 3 is a tilted pyramid. The distance between each slice is 1 mm (1000 μm) and each element has 64 discrete possible height levels.

The results for Design 1 are shown in FIGS. 8A-8F. The optimized holomask is described by the 1-D (one dimensional) height distribution shown in FIG. 8A. The change in the metric as a function of iteration number is shown in the convergence plot of FIG. 8B. In this example, the metric was diffraction efficiency, and hence increases with each iteration. The images corresponding to the four planes are shown in FIGS. 8C-F. The desired image in FIGS. 8C-8F is shown as the trapezoidal shape overlayed near the bottom of the intensity distribution. Note that all the images are within the bounds of the desired image, even though the uniformity of the image is not excellent. This non-uniformity is not problematic for lithography since the photoresist will act as a nonlinear recording material and smooth out these spatial variations.

Figure 9A:
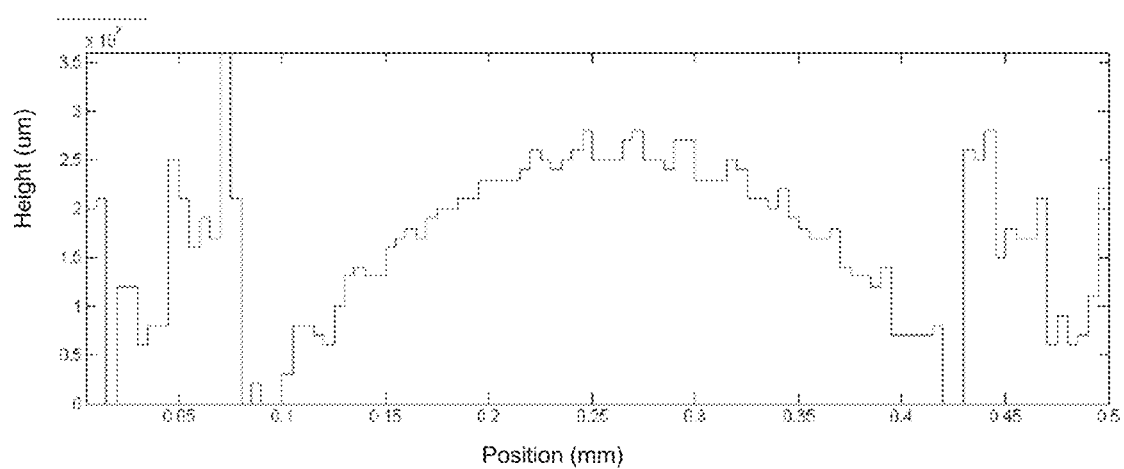
FIGS. 9A-9F include graphs representing results of various holographic mask design examples in accordance with the present technology.
Figure 9B:
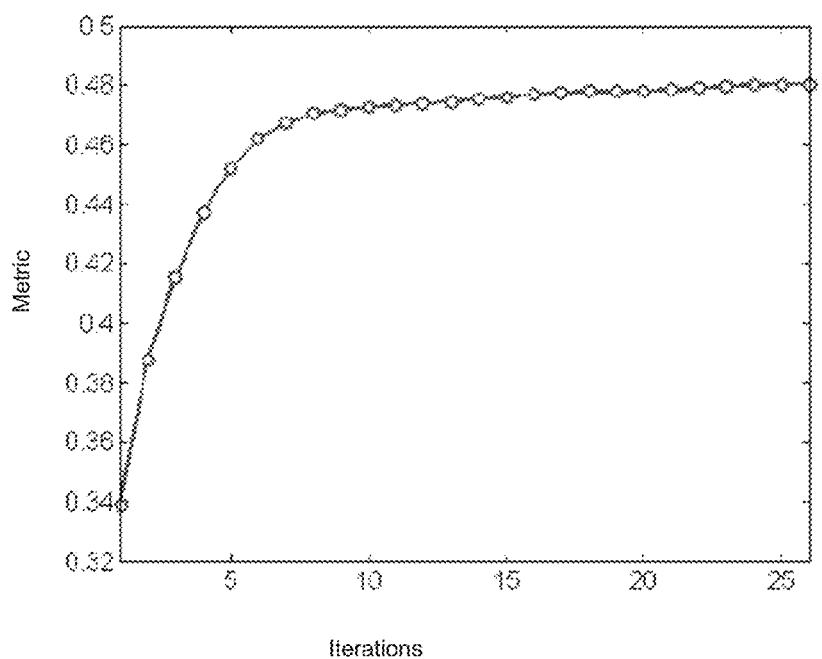
Figure 9C:
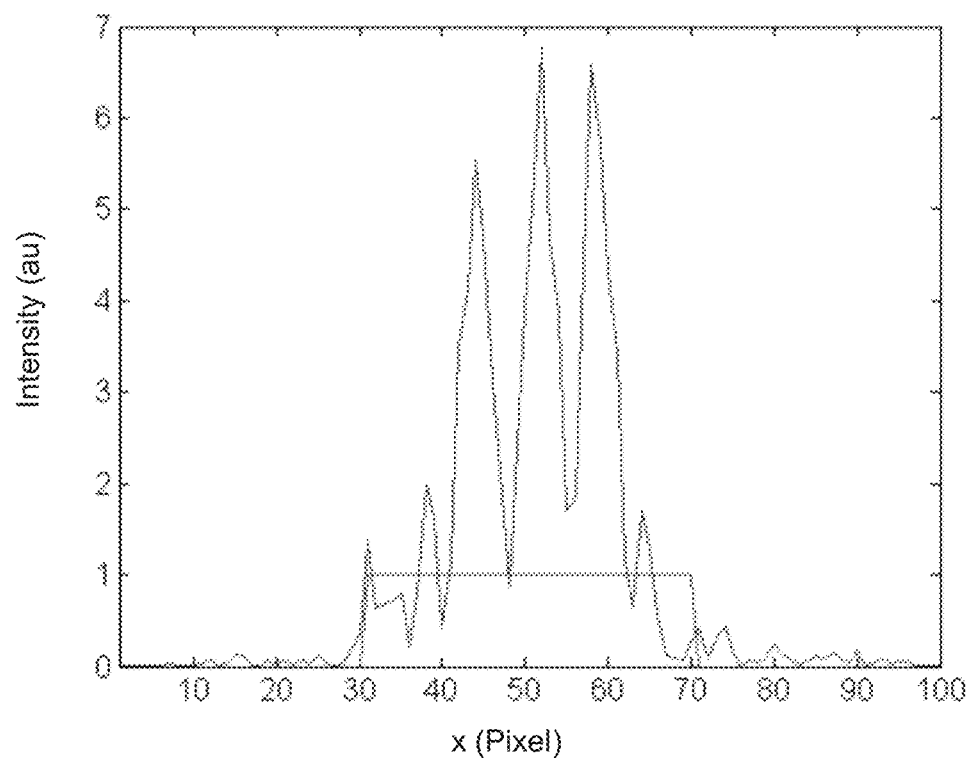
Figure 9D:
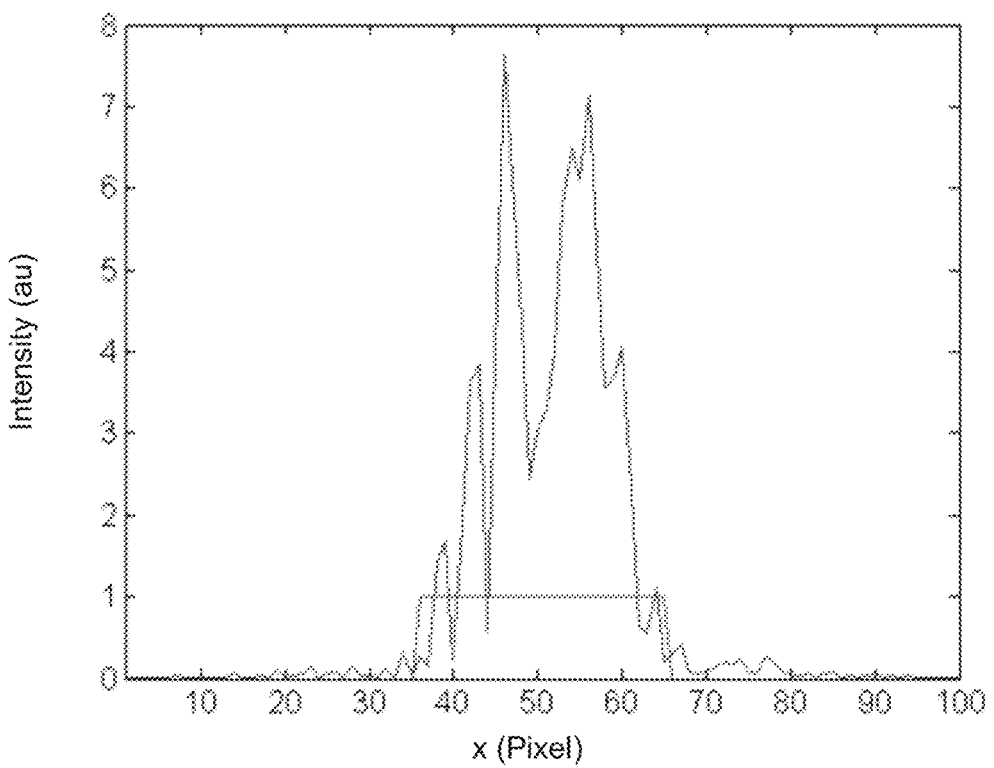
Figure 9E:
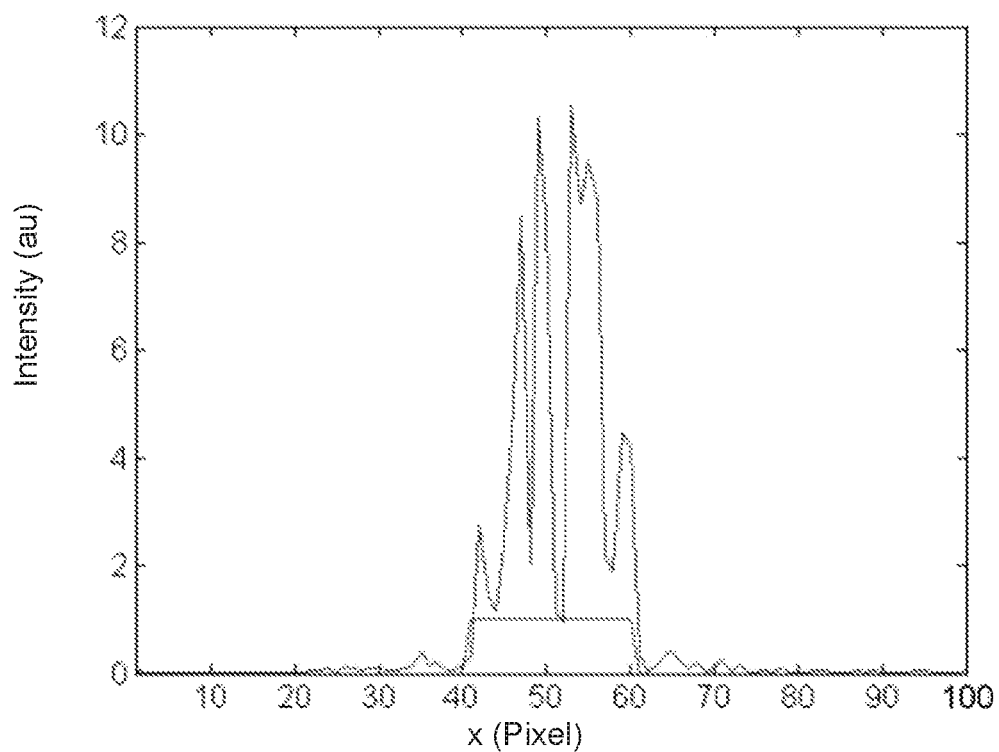
Figure 9F:
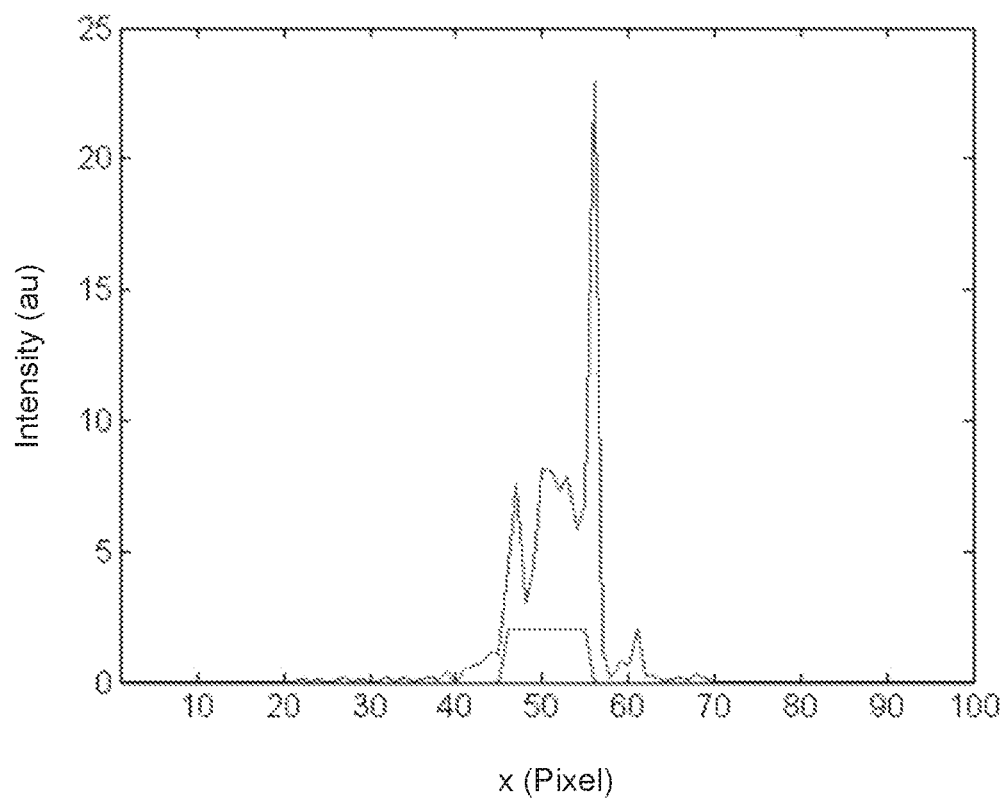
Figure 10A:
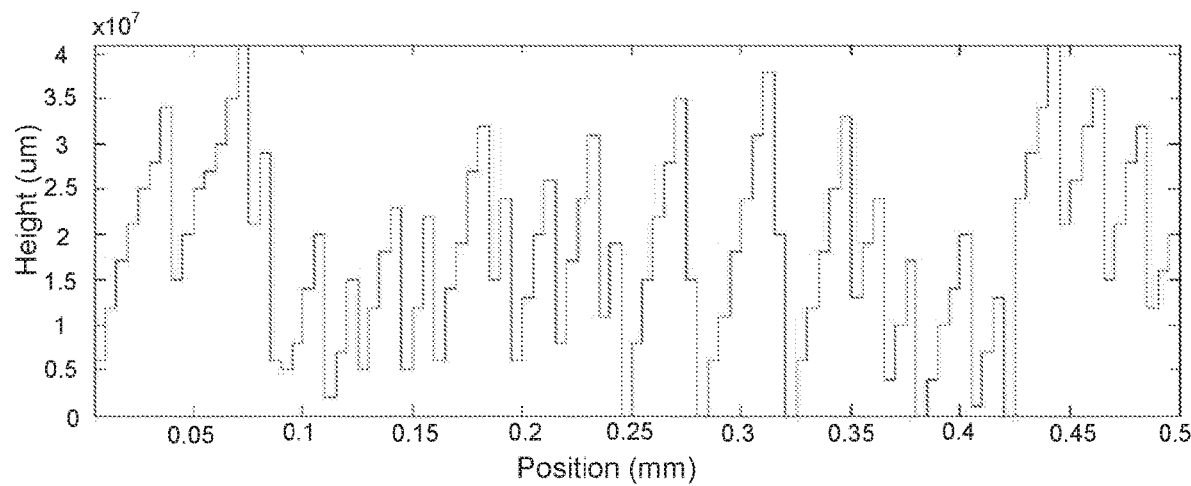
FIGS. 10A-10F include graphs representing results of various holographic mask design examples in accordance with the present technology.
Figure 10B:
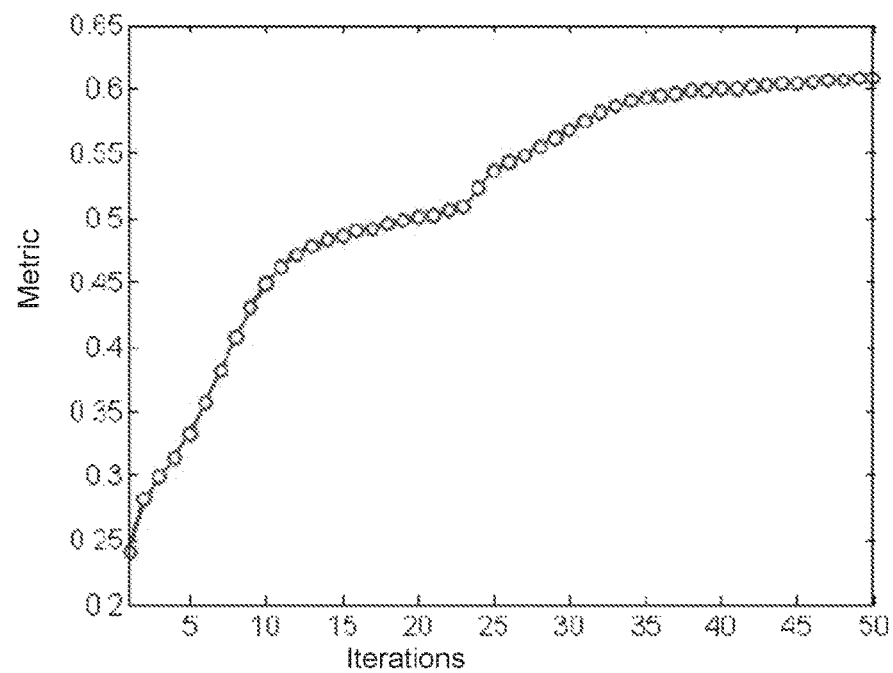
Figure 10C:
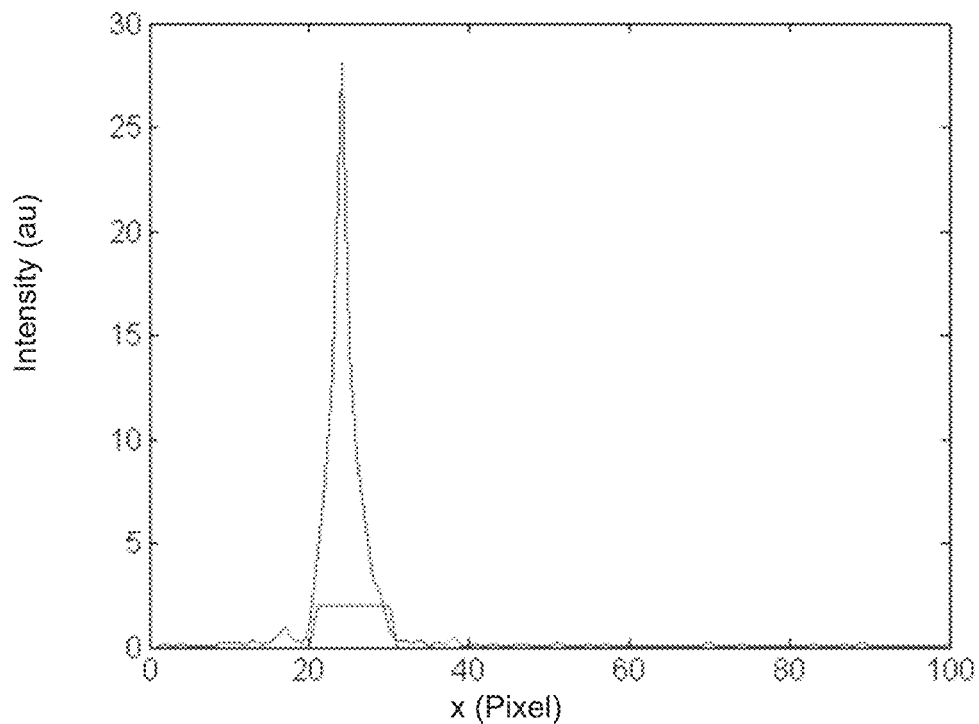
Figure 10D:
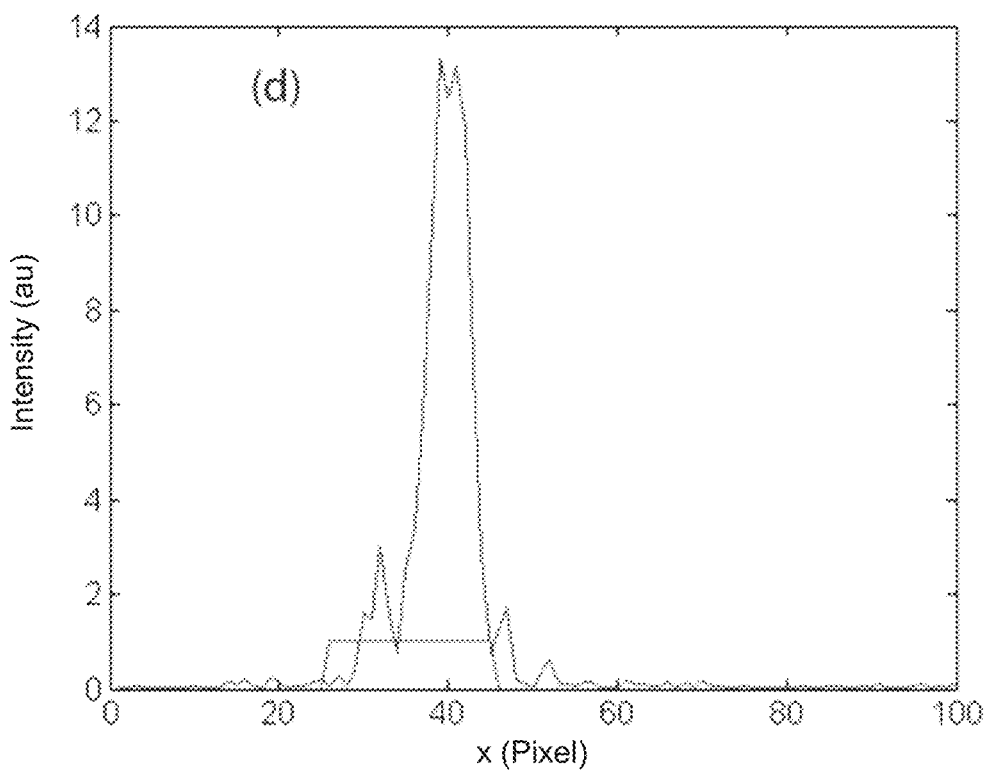
Figure 10E:
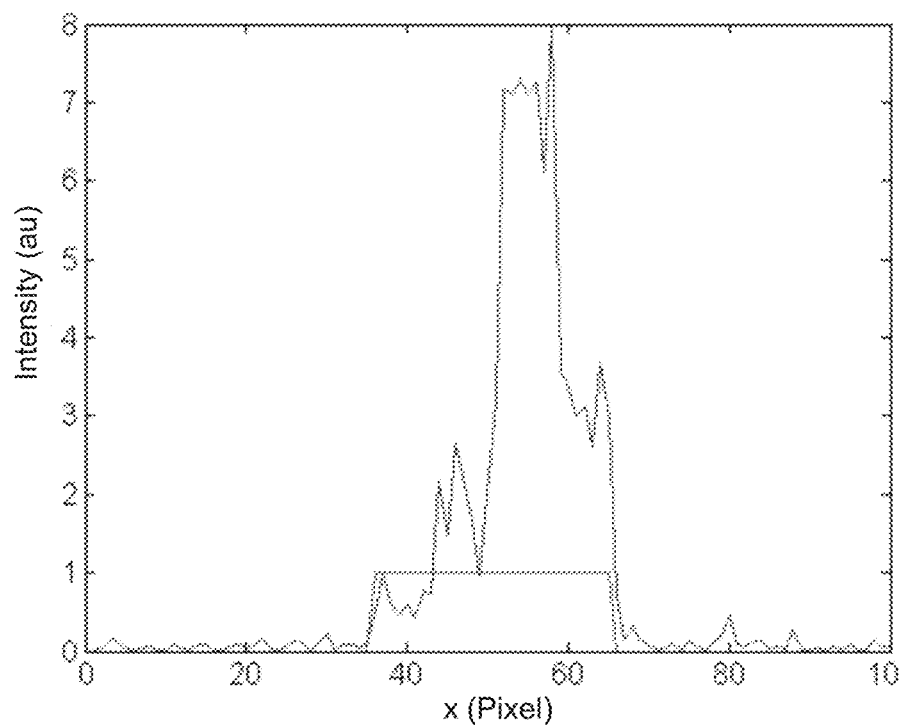
Figure 10F:
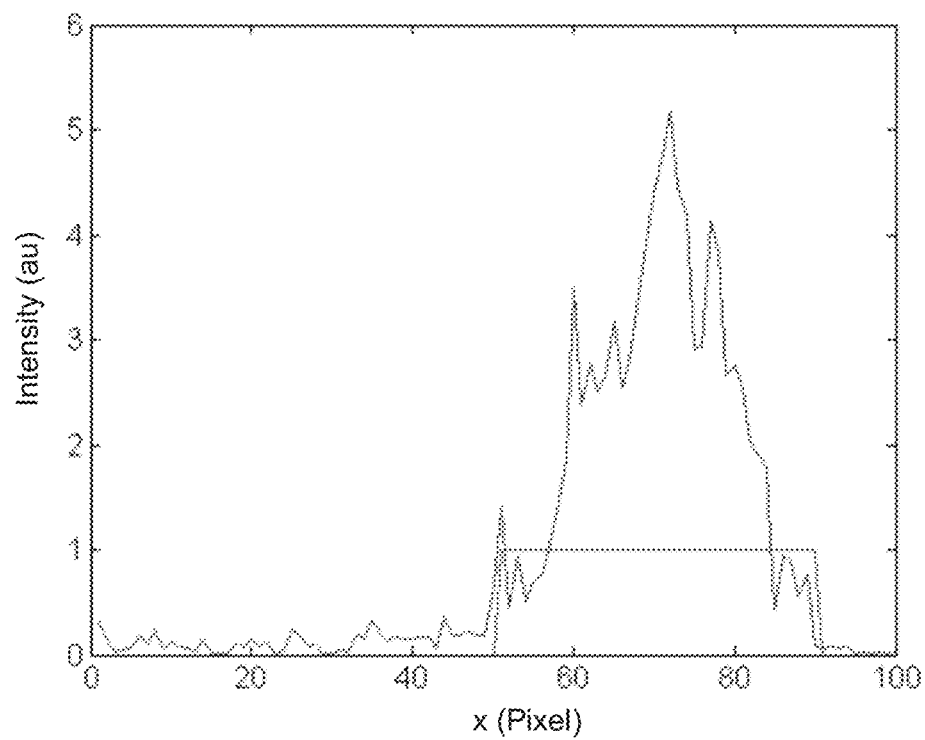

Similar results for Designs 2 and 3 are shown in FIGS. 9A-9F and 10A-10F, respectively. FIG. 9A shows an optimized holomask for Design 2, while FIG. 9B shows the corresponding a convergence plot of diffraction efficiency. FIGS. 9C-9F show resulting images at four planes which are exposed simultaneously, including the desired image represented by the trapezoidal shape near the base of the distribution. FIG. 10A shows the optimized holomask for Design 3. FIG. 10B is a corresponding convergence plot for diffraction efficiency as the metric. FIG. 10C-10F show the resulting images at four planes, including the desired image represented by the trapezoidal shape near the base of the distribution.

Next, a full 3-D image design example is provided, where multiple planes along the optical axis have different 2-D images. For illustration, a simple pyramid composed of 3 slices along the optical axis was used. Each stripe in the image was 20 μm wide and the distance between stripes was also 20 μm. Note that care must be taken to choose the gap between the first image plane and the holomask such that light has enough distance to propagate and diffract into the appropriate areas. This can be readily determined using the simple grating equation: sin θ=λ/P, where θ is diffraction angle and P is local period of the grating. The design parameters are shown in Table 2.

TABLE 2

Parameters for 3D Field Generation

| Design | Pixel Size (μm) | Number of Levels | Thickness (μm) | Number of Pixels |
|---|---|---|---|---|
| 1 | 5 | 64 | 2 | 50 × 50 |
| Material | Propagation Distance (m) | Gap (mm) | Wavelength (nm) | Number of Slices |
| s1813 | 0.03 | 1 | 532 | 3 |

Figure 11A:
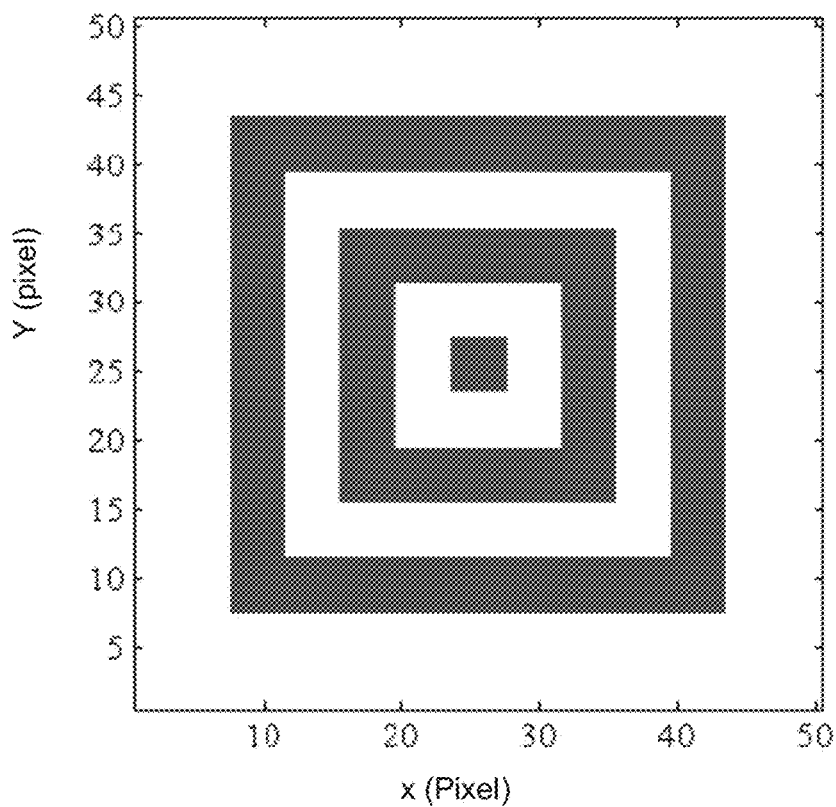
FIG. 11A-11F includes graphs representing results of a 3D holographic mask design example in accordance with the present technology.
Figure 11B:
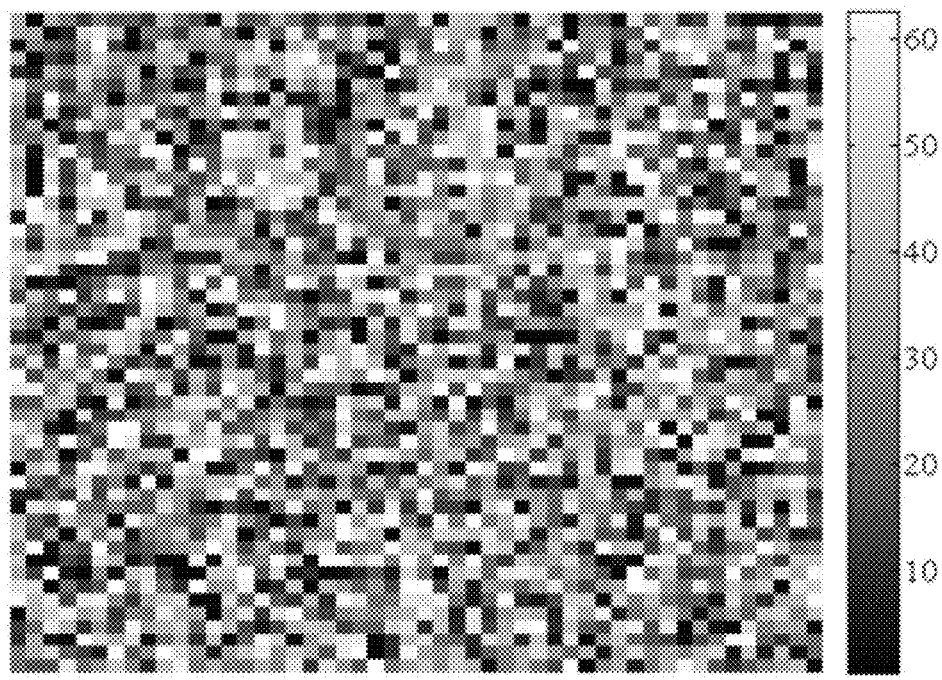
Figure 11C:
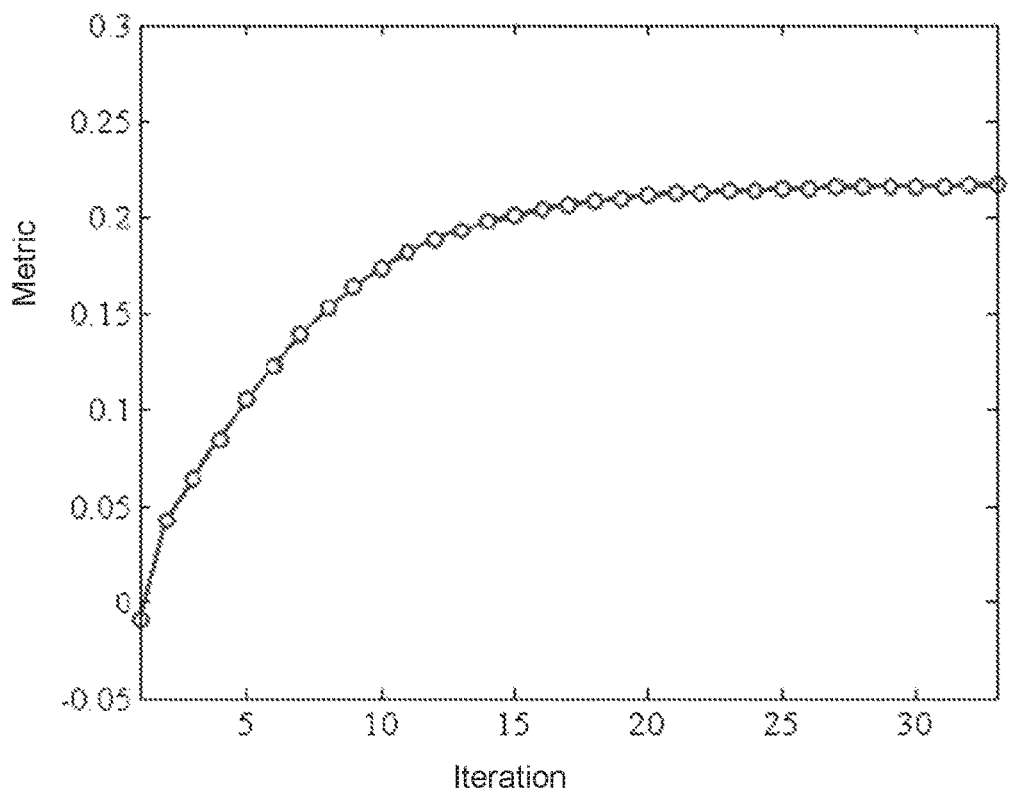
Figure 11D:
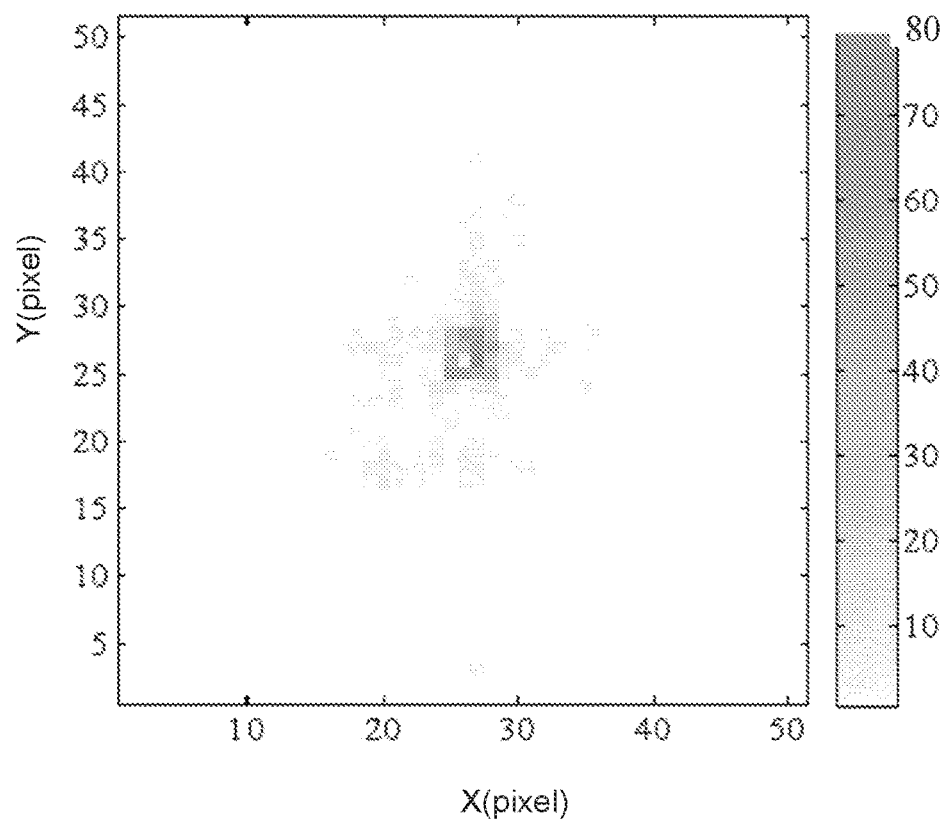
Figure 11E:
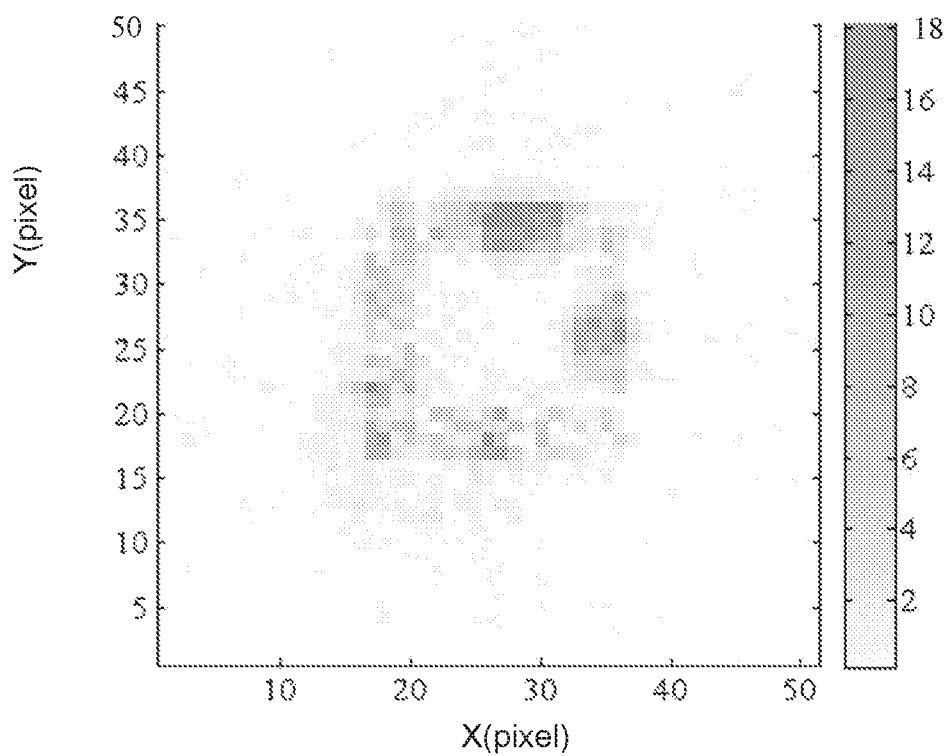
Figure 11F:
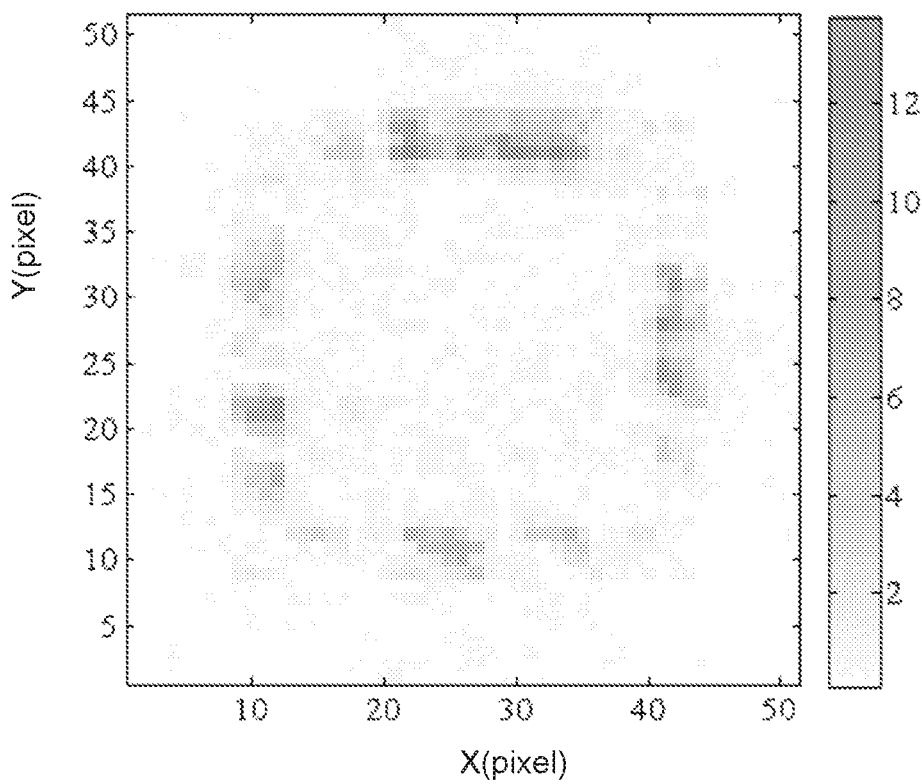

The target image is shown in FIG. 11A. Each square-shaped ring is in a different plane separated from the one next to it by 1 mm along the optical axis. The optimized holomask is shown in FIG. 11B. The corresponding convergence plot of diffractive efficiency is shown in FIG. 11C. The corresponding resulting images in each of the three planes are shown in FIGS. 11D-11F, respectively.

While the forgoing examples are illustrative of the principles of the present technology in one or more particular applications, it will be apparent to those of ordinary skill in the art that numerous modifications in form, usage and details of implementation can be made without the exercise of inventive faculty, and without departing from the principles and concepts of the technology. Accordingly, it is not intended that the technology be limited, except as by the claims set forth below.

What is claimed is:

1. An iterative pixelated perturbation method of generating a three dimensional holographic mask based on a predetermined three dimensional pattern, comprising:

providing a starting pattern for the holographic mask;
computing images at multiple planes parallel to the holographic mask using a processor;
computing an image metric representing a combination of diffraction efficiency of the holographic mask and fidelity of an image resulting from the holographic mask compared with the predetermined pattern for the images at the multiple planes using the processor;
perturbing an optic height of a first pixel in the starting pattern to create an intermediate pattern;
computing intermediate images resulting from the intermediate pattern and computing an intermediate metric for the intermediate pattern; and
determining whether the intermediate metric for the intermediate pattern is an improvement over the metric for the starting pattern,
wherein the holographic mask is a pixelated matrix formed as a topographical pattern of the predetermined three dimensional pattern on a transparent mask substrate and includes more than two discrete levels at defined elevations.

2. The method of claim 1, wherein the image metric includes at least one of exposure latitude, line-edge roughness, and manufacturability.

3. The method of claim 1, wherein the image metric includes at least one of normalized inverse image slope, robustness, and throughput.

4. The method of claim 1, wherein perturbing the optic height of the first pixel comprises at least one of increasing or decreasing the optic height by a predetermined height unit.

5. The method of claim 4, the method further comprising:
perturbing the optic height of the first pixel in an opposite increasing or decreasing optic height direction when the metric for the intermediate pattern is not an improvement over the metric for the starting pattern to create a second intermediate pattern;
computing images resulting from the second intermediate pattern and computing the metric for the second intermediate pattern; and
determining whether the metric for the second intermediate pattern is an improvement over the metric for the starting pattern.

6. The method of claim 5, further comprising discarding perturbation of the optic height of the first pixel when the metric for the second intermediate pattern is not an improvement over the metric for the starting pattern, and performing the steps of perturbing, computing, and determining for a second pixel.

7. The method of claim 1, further comprising performing the steps of perturbing, computing, and determining for a second pixel when the metric for the intermediate pattern is an improvement over the metric for the starting pattern.

8. The method of claim 1, wherein computing images at multiple planes parallel to the holographic mask comprises computing images corresponding to image slices from the predetermined three dimensional pattern.

9. The method of claim 1, wherein the images computed at the multiple planes parallel to the holographic mask are two dimensional images.

10. The method of claim 1, wherein the images computed at the multiple planes parallel to the holographic mask are three dimensional images.

11. The method of claim 1, wherein the images computed at the multiple planes parallel to the holographic mask are produced using an angular-plane wave spectrum propagation method.

12. The method of claim 1, wherein each of the more than two discrete levels are subdivided into an array of pixels having stepped heights independent of adjacent pixels.

13. The method of claim 1, further comprising: incorporating Fresnel reflection coefficients to determine an amount of light reflected from a surface of the three dimensional holographic mask.

14. The method of claim 1, further comprising: patterning a surface of the three dimensional holographic mask with a single exposure using a transparent roller.

15. The method of claim 1, wherein the three dimensional holographic mask utilizes multiple wavelengths for illumination.

* * * * *